(12) United States Patent
Krishnan et al.

(10) Patent No.: US 7,447,958 B2
(45) Date of Patent: Nov. 4, 2008

(54) PARALLEL INPUT/OUTPUT SELF-TEST CIRCUIT AND METHOD

(75) Inventors: Gopalakrishnan Perur Krishnan, Bangalore (IN); Eswar Vadlamani, Hyderabad (IN); Tarjinder Singh Munday, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 33 days.

(21) Appl. No.: 11/429,129

(22) Filed: May 4, 2006

(65) Prior Publication Data
US 2006/0253752 A1    Nov. 9, 2006

Related U.S. Application Data

(60) Provisional application No. 60/678,300, filed on May 5, 2005.

(51) Int. Cl.
*G01R 31/28* (2006.01)
(52) U.S. Cl. .................. 714/724; 370/241; 375/376; 375/326; 375/328
(58) Field of Classification Search .................. None
See application file for complete search history.

(56) References Cited

U.S. PATENT DOCUMENTS

| | | | |
|---|---|---|---|
| 4,070,648 A * | 1/1978 | Mergenthaler et al. ........ 714/18 |
| 4,393,491 A * | 7/1983 | Ashlock et al. ............. 370/249 |
| 5,673,130 A * | 9/1997 | Sundstrom et al. .......... 398/154 |
| 5,822,228 A | 10/1998 | Irrinki et al. |
| 6,069,927 A * | 5/2000 | Kikuchi ....................... 375/357 |
| 6,078,637 A | 6/2000 | Ansel et al. |
| 6,327,685 B1 | 12/2001 | Koprowski et al. |
| 6,438,717 B1 * | 8/2002 | Butler et al. ................. 714/704 |
| 6,584,592 B2 | 6/2003 | Omura et al. |
| 6,671,842 B1 | 12/2003 | Phan et al. |
| 6,675,336 B1 | 1/2004 | Thakur et al. |
| 6,681,359 B1 | 1/2004 | Au et al. |
| 6,684,358 B1 | 1/2004 | Rajski et al. |
| 6,690,309 B1 | 2/2004 | James et al. |
| 6,961,886 B2 * | 11/2005 | Motika et al. ............... 714/732 |
| 2001/0021938 A1 | 9/2001 | Omura et al. |
| 2004/0234014 A1* | 11/2004 | Chen .......................... 375/350 |

OTHER PUBLICATIONS

U.S. Appl. No. 10/785,826, Li et al.
U.S. Appl. No. 10/876,864, Maheshwari et al.

* cited by examiner

*Primary Examiner*—Jacques Louis-Jacques
*Assistant Examiner*—Guerrier Merant
(74) *Attorney, Agent, or Firm*—Haverstock & Owens, LLP

(57) ABSTRACT

A parallel data transmission test system can include a receiver section (100) having input selector circuits (104-O to 104-N) that provide a received test data to logic adjust circuits (106-O to 106-N) that "logically align" multiple incoming test values to remove intentionally introduced logic difference (e.g., inversion) with respect to one another. Result combining circuit (108) can logically combine output data values and provide a resulting sequence to a pattern sequence test circuit (110).

7 Claims, 5 Drawing Sheets

PARALLEL INPUT/OUTPUT SELF-TEST CIRCUIT AND METHOD

This application claims the benefit of U.S. Provisional Application Ser. No. 60/678,300 filed May 5, 2005, the contents of which are incorporated by reference herein.

TECHNICAL FIELD

The present invention relates generally to parallel data transmission systems, and more particularly to test circuits for parallel data transmission systems.

BACKGROUND OF THE INVENTION

In order to reduce overall testing costs of electronic devices, many systems and/or integrated circuits are fabricated with built-in self-test (BIST) circuits. Such circuits are considered "built-in" as they are formed as part of the system itself, or are included in the substrate of an integrated circuit. A BIST circuit can generate and/or evaluate test signals applied/received to a portion of the integrated circuit or system. BIST capabilities can reduce test times, as the on-board BIST circuits can usually apply or evaluate test signals faster than a standalone tester.

While BIST circuits may test various features of an integrated circuit device, one feature that can benefit from BIST circuits can be interface circuits for transmitting signals between devices or sections of a system. One particular type of interface is the source synchronous parallel interface. A source synchronous parallel interface can transmit data in parallel, and timing for such signals can be based on a transmitting source of the parallel data.

It can be desirable to provide self-testing capabilities for the input and/or output path of an integrated circuit. Such a testing capability can help determine if a data transmission path is introducing errors into data signals. To better understand various aspects of the invention, a BIST approach for a source synchronous parallel interface will now be described. A parallel I/O BIST arrangement is shown in FIG. 5 and designated by the general reference character 500. A test system 500 can include a transmitter section 502 and a receiver section 504. A transmitting section 502 can include functional data inputs lines 506 provided from other portions (e.g. non-test) of a device and a BIST transmitter 508 that generates test data values. Multiplexers 510 can selectively output functional data (func_data[0] to func_data[N]) in a normal (e.g., non-test) mode of operation or BIST test data (test_data[0] to test_data[N]) in a test mode of operation. Data can be transmitted from a transmitter section 502 to a receiver section 504 via parallel link interface 512.

A receiver section 504 can include functional logic 514 that can process functional (non-test) data received from a transmitter section 502, and a BIST receiver 516 that can process test data, and thereby test whether data is being properly transmitted via the interface.

It is desirable for a BIST transmitter 508 and BIST receiver 516 to be capable of detecting common parallel interface type faults including "stuck-at" faults and coupling faults. Stuck-at faults in the parallel link interface 512 can result in a constant output pattern of "1" or "0". Coupling faults can be caused by a data value on one line adversely affecting that of another line. For example, coupling faults can be tested by the transmission of a pseudo-random bit sequence (PRBS).

FIG. 6 shows a conventional BIST transmitter 608 like that shown as item 508 in FIG. 5, and a conventional BIST receiver 616 like that shown as 516 in FIG. 5.

A conventional BIST transmitter section 608 can include constant bit value source 650, a PRBS generator 652, and select MUXs (654-0 to 654-N). Constant bit value source 650 can provide constant binary values to select MUXs (654-0 to 654-N). PRBS generator 652 can generate a pseudo-random sequence of bit values, in both inverted and non-inverted form, and provide such values to select MUXs (654-0 to 654-N). Each select MUX (654-0 to 655-N) can output one of the constant bit values (0 or 1) or a pseudo-randomly generated bit (or its inverse) according to corresponding pattern select signals (pattern_select_0[0:1] to pattern_select_N[0:1]).

A conventional BIST receiver section 616 can provide a number of tests to detect errors in data transmitted from a BIST transmitter 608. A receiver section 616 can include a PRBS pattern check circuit 656, a constant 0 test circuit 658, a constant 1 test circuit 660, and pass/fail logic 662.

A constant 0 test circuit 658 can test data when all signals transmitted are logic lows (0). Thus, such a circuit can logically OR all such values and flag an error by outputting a high value ZERO_RES. Conversely, a constant 1 test circuit 660 can test data when all signals transmitted are logic highs (1), and thus can logically NAND all such values. If a "0" is detected, an error is present, and test circuit 660 can output a high result value ONE_RES.

A pattern check circuit 656 can check for errors in a PRBS bit sequence. In the conventional example shown, a pattern check circuit 656 can include a PRBS checker (656-0 to 656-N) corresponding to each transmitted data bit. Each PRBS checker (656-0 to 656-N) can provide a result signal (RES[0] to RES[N]) that goes to a logic high in the event a received data value does not match an expected data value. Result signals are logically combined (ORed) in a pattern result circuit 657. Thus, if any bit has an error as determined by PRBS checker (656-0 to 656-N), pattern result circuit 657 will output a high result PRBS_RES.

Results from a constant 0 test circuit 658, a constant 1 test circuit 660, and pattern result circuit 657 can be logically ORed in a pass/fail result circuit 662 to provide an overall test result Pass/Fail Status.

It is almost always desirable to reduce an overall size of an integrated circuit, as reductions in size can translate into lower costs. Accordingly, it would be desirable to arrive at some way of providing a BIST arrangement for a parallel interface that presents a more compact circuit than conventional arrangements, like that of FIG. 6.

DETAILED DESCRIPTION

Figure 1:
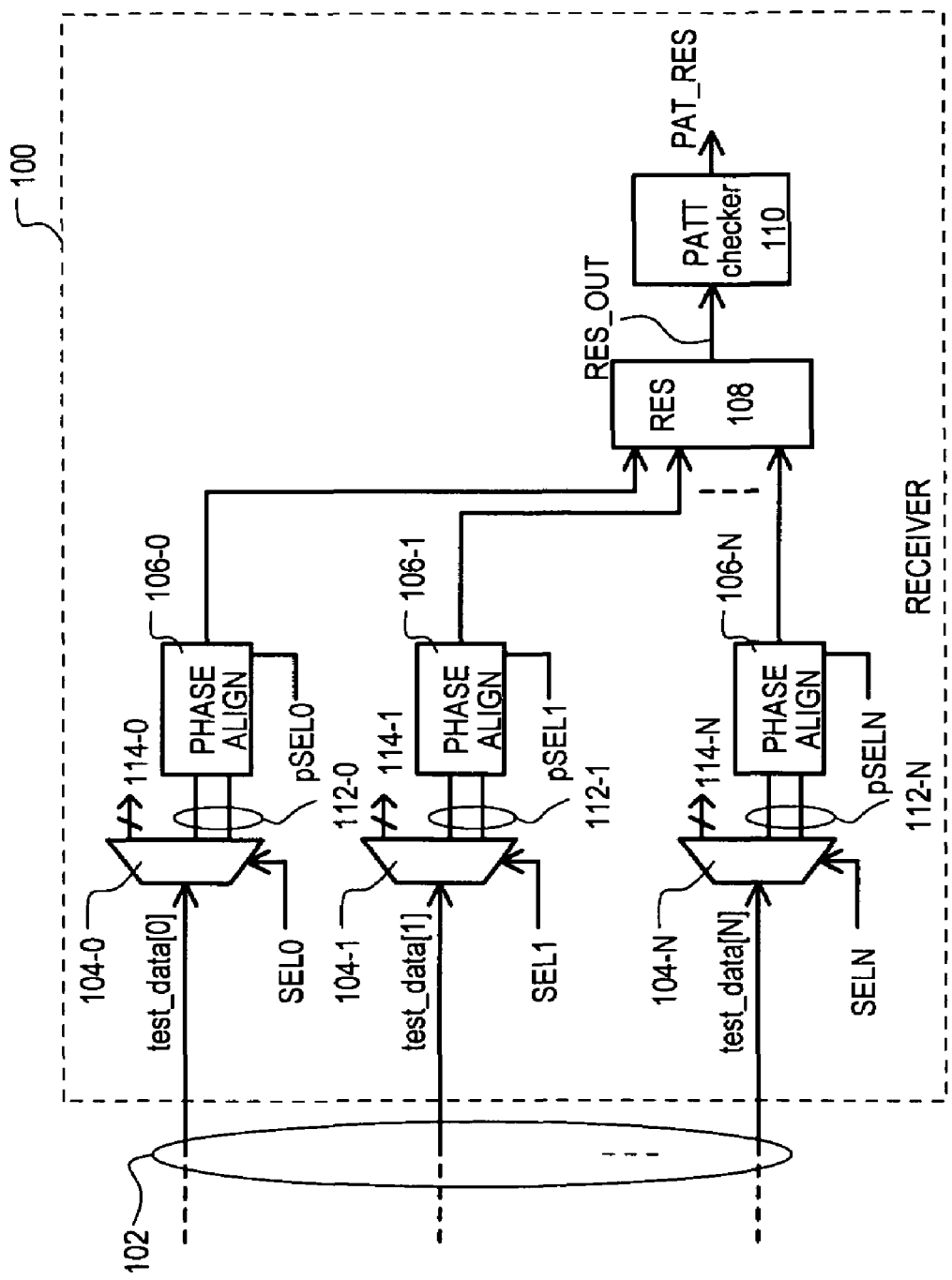
FIG. 1 is a block schematic diagram of a first embodiment of the present invention.

FIG. 1 shows a parallel data transmission test circuit according to a first embodiment of the present invention. A test circuit can include a receiver section 100 that receives test data (test_data[0] to test_data[N]) transmitted on parallel transmission lines 102, and provide a pattern result value PAT_RES based on the received test values (test_data[0] to test_data[N])).

A receiver section 100 according to a first embodiment can include input selector circuits 104-0 to 104-N and phase aligner circuits 106-0 to 106-N corresponding to each parallel transmission line 102. A receiver section 100 can also include a result combining circuit 108 and pattern sequence test circuit 110. Each input selector circuit (104-0 to 104-N) can provide a received test data value on one or more selector outputs according to corresponding input selector values SEL0 to SELN. In the example shown, each input selector circuit (104-0 to 104-N) can include logic altered outputs (112-0 to 112-N) as well as other test outputs (114-0 to 114-N). Logic altered outputs can provide test data values that are expected to be different from one another (e.g., inverses). Other test outputs can provide test data for different types of tests.

Logic adjust circuits (106-0 to 106-N) can selectively alter incoming data values to "logically align" multiple incoming test values in response to phase aligning control signals PSEL0 to PSELN. That is, received parallel test data values can have an expected, intentionally introduced logic difference (e.g., inversion) with respect to one another. Logic adjust circuits (106-0 to 106-N) can remove such phase differences to provide uniform output data values test_out[0] to test_out[N], assuming no error has been introduced during transmission of such data values. In a preferred embodiment, aligning control signals PSEL0 to PSELN can be a subset of input selector values SEL0 to SELN. Result combining circuit 108 can logically combine output data values from logic adjust circuits (106-0 to 106-N) (e.g., be an OR or NOR logic circuit). A result of such combination RES_OUT can be applied to a pattern sequence test circuit 110. A pattern sequence test circuit 110 can compare a received pattern of data values from result combining circuit 108 and determine whether such values match an expected pattern of data values.

Preferably, a receiver section 100 can be a built-in self-test (BIST) circuit incorporated into a receiving device. As but one example, a receiver section 100 can be formed in a substrate of an integrated circuit device, such as a content addressable memory (CAM) device, a random access memory (RAM) device, an electrically erasable programmable read only memory (EEPROM), including a flash EEPROM, to name but a few of the many possible examples.

Figure 6:
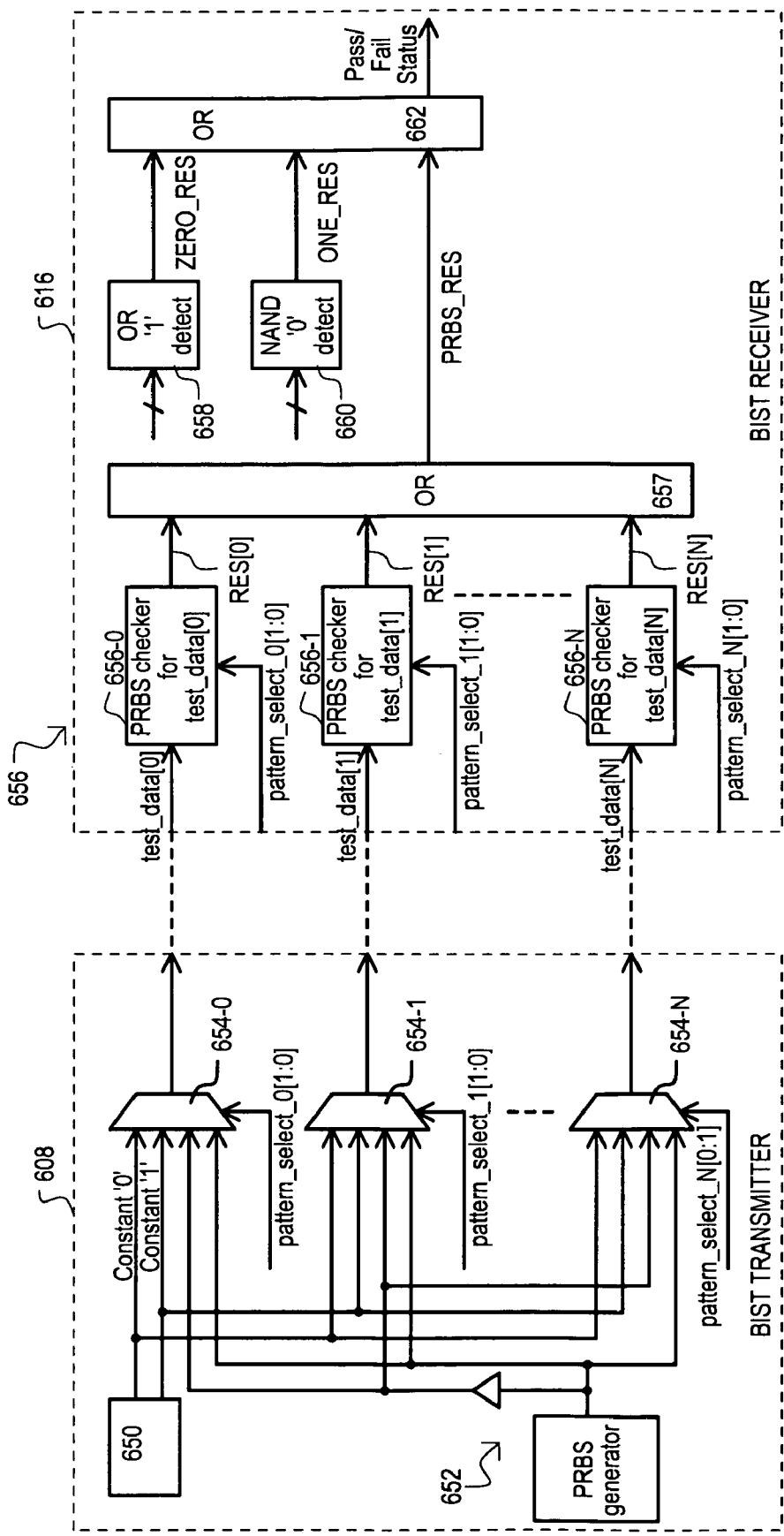
FIG. 6 is block schematic diagram of a conventional BIST arrangement for a parallel interface.

In this way, a receiver section 100 can include a single pattern sequence test circuit 110 for multiple test input values, in contrast to a conventional arrangement like that of FIG. 6, which includes a pattern check circuit for each of N+1 test input values. Thus, an embodiment like that of FIG. 1 can allow for a more compact test circuit size over the conventional case.

Figure 2:
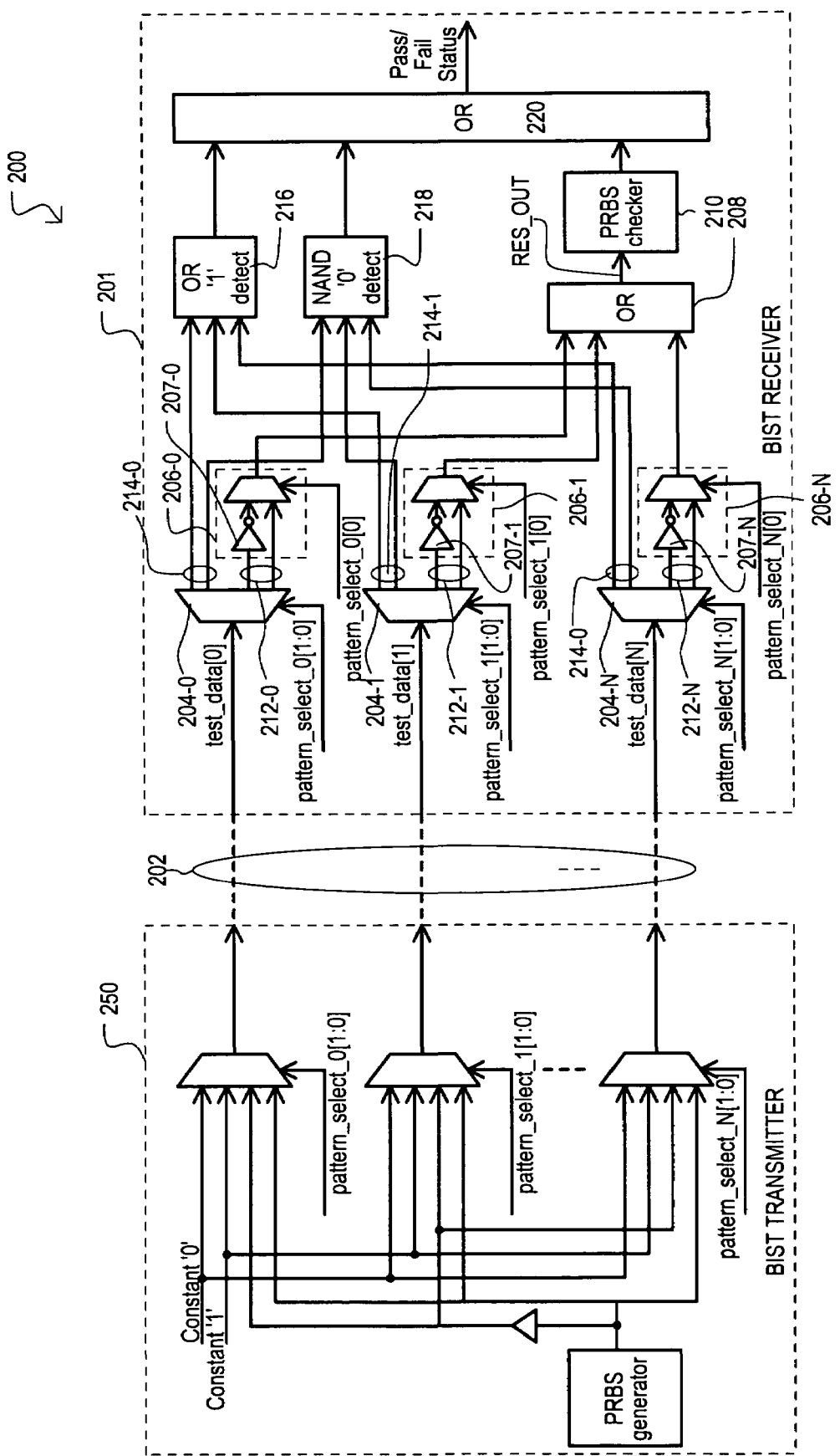
FIG. 2 is a block schematic diagram of a second embodiment of the present invention.

A second embodiment test system is shown in FIG. 2, and designated by the general reference character 200. A test system 200 can include a receiver section 201 and transmitting section 250. A receiver section 201 can include some of the same general components as the receiver section of FIG. 1. Accordingly, like components will be referred to by the same reference character but with the first digit being a "2" instead of a "1".

In the particular receiver section 201 of FIG. 2, each input selector circuit (204-0 to 204-N) can include a de-multiplexer (de-MUX) that can output a data value onto one of four outputs based on a corresponding two bit pattern select values (pattern_select_0[1:0] to pattern_select_N[1:0]). Test outputs (214-0 to 214-N) can include a constant 0 output and a constant 1 output. Logically altered outputs can include a non-inverted pattern output and inverted pattern output.

FIG. 2 also shows a particular example of logic adjust circuits (206-0 to 206-N). Each logic adjust circuit (206-0 to 206-N) can include an inverter (207-0 to 207-N) and a multiplexer (MUX). Each such inverter (207-0 to 207-N) can receive test data from an inverted pattern output, invert such values, and provide them to an input of the corresponding MUX. The other input of the MUX can receive data from a non-inverted pattern output of the de-MUX. MUXs within logic adjust circuits (206-0 to 206-N) can be controlled by one bit of the two bit pattern select values (pattern_select_0[0] to pattern_select_N[0]).

A result combining circuit 208 can include a multi-input OR circuit that receives output values from each logic adjust circuit (206-0 to 206-N), and logically ORs such values to provide a result output RES_OUT.

A pattern sequence test circuit 210 can include a pseudo-random binary sequence check circuit. Such a circuit can output a "1" when a received test pattern data value does not match an expected value.

Receiver section 201 can also include a first constant value detect circuit 216 that receives test data from a constant 0 output of each input selector circuit (204-0 to 204-N). In the example shown, the first constant value detect circuit 216 can be a multi-input OR circuit that can output a 1 when any of received test values is a "1".

Receiver section 201 can further include a second constant value detect circuit 218 that receives test data from a constant 1 output of each input selector circuit (204-0 to 204-N). In the example shown, the second constant value detect circuit 218 can be a multi-input NAND circuit that can output a 1 when any of received test values is a "0".

Outputs from pattern sequence test circuit 210, first constant value detect circuit 216, and second constant value detect circuit 218 can be received by a test result circuit 220. In the example of FIG. 2, a test result circuit 220 can be a multi-input OR circuit that generates a pass/fail status value.

The test circuit 200 of FIG. 2 can also include a transmitter section 250. A transmitter section 250 can have the same general structure as BIST transmitter 608 of FIG. 6. It is understood that pattern select signals (pattern_select_0[0:1] to pattern_select_N[0:1]) of receiving section 201 are based on those of transmitting section 250.

As in the case of FIG. 1, preferably, a test system 200 can form a BIST arrangement. More particularly, a receiver section 201 can be a BIST circuit incorporated into a receiving device (e.g., formed in a substrate of a first integrated circuit device). Transmitting section 250 can form part of a second, different transmitting device (e.g., formed in a substrate of a second integrated circuit device).

A parallel data transmission test system according to the above embodiments can have an advantageously smaller gate count than the above conventional approaches as a receiver section can include, for N+1 input test signals, one such pattern sequence test circuit.

Figure 3:
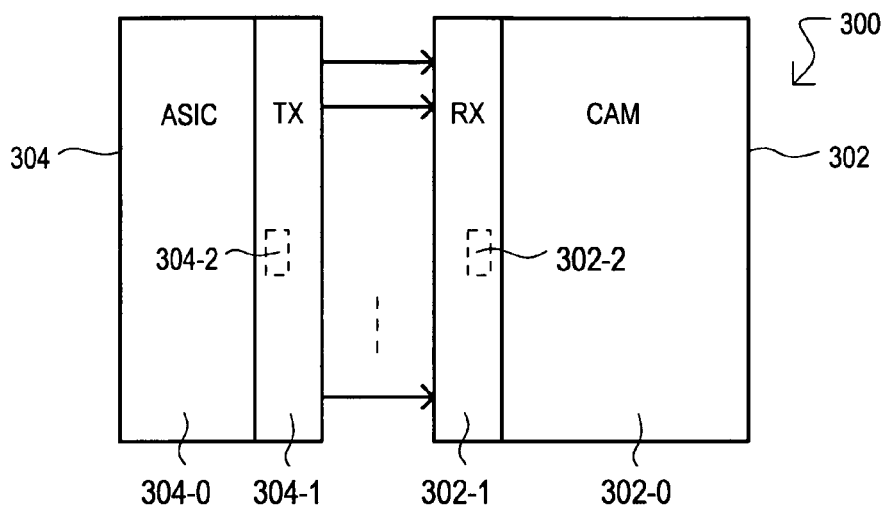
FIG. 3 is a block schematic diagram of a third embodiment of the present invention.

The present invention can also include a particular system configuration that includes test circuits like those described. One example of such an arrangement is shown in FIG. 3. A system 300 can be a search engine system that includes one or more CAM devices 302 controlled by a search control device 304. A search control device 304 can issue commands and data to a CAM device 302 over parallel data lines 306. Thus, a search control device 304 can include logic 304-0 and a parallel transmitter interface 304-1. In one arrangement, a parallel transmitter interface 304-1 can have the structure of a transmitter section like that shown as 250 in FIG. 2, and so can include a test sequence bit generator 304-2.

A CAM device 302 can include search circuits 302-0 and a parallel receiver interface 302-1. A parallel receiver interface 302-1 can have the structure of a receiver section like that shown in FIGS. 1 and/or 2, and so can include a single pattern sequence test circuit 302-2 and hence a more compact size.

Figure 4:
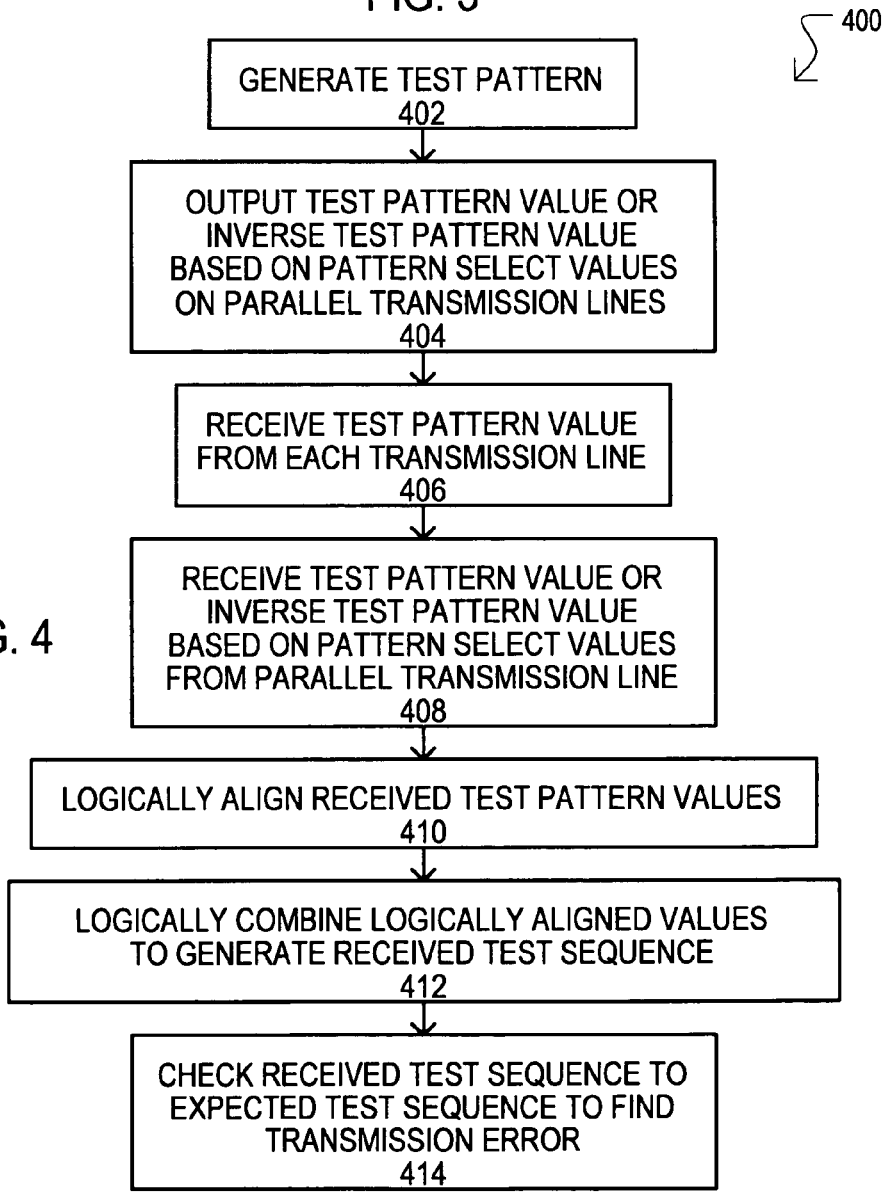
FIG. 4 is a flow diagram of a method according to another embodiment of the present invention.
Figure 5:
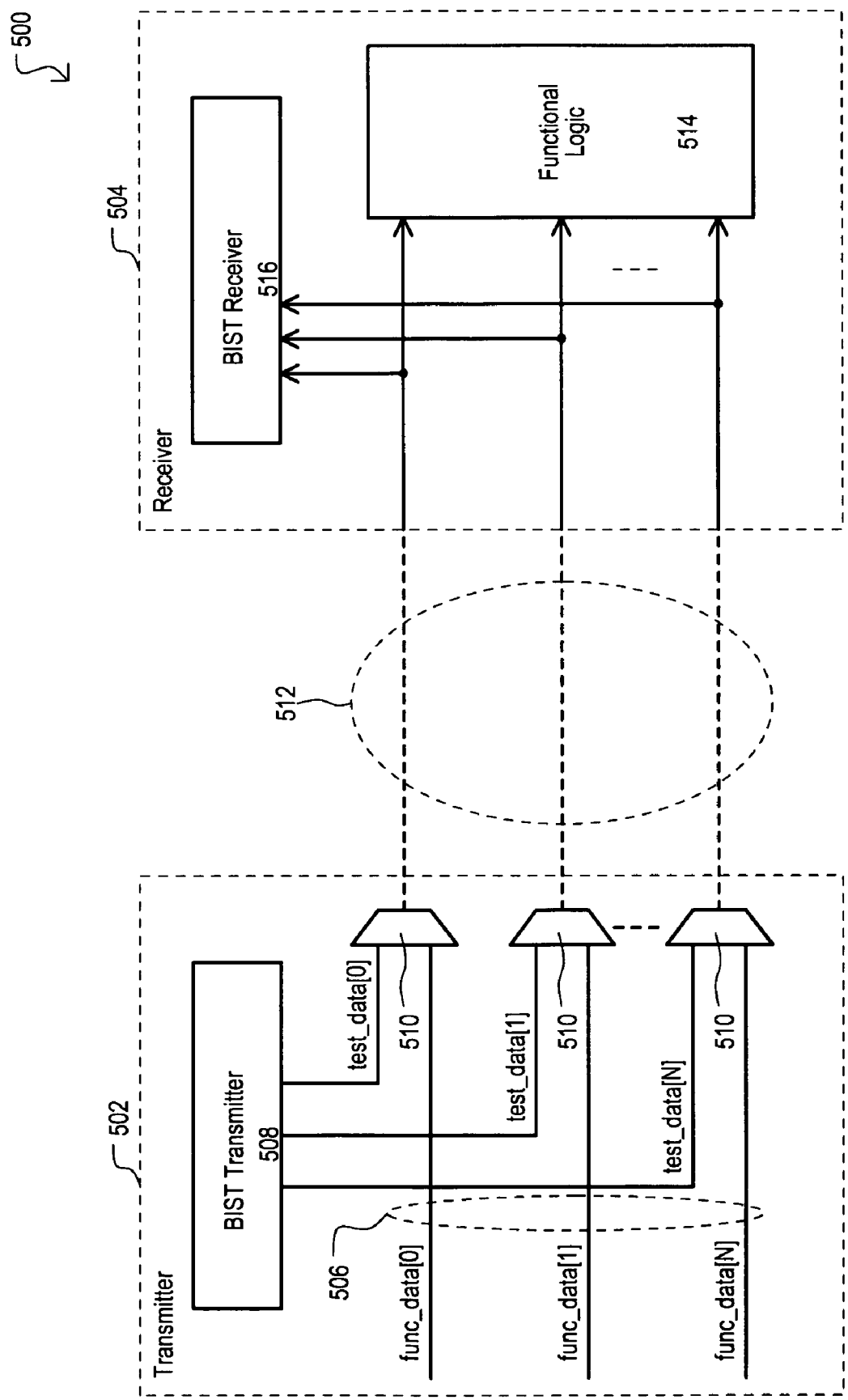
FIG. 5 is block schematic diagram of a parallel interface having built-in self-test (BIST) capabilities.

The present invention can also include a method for combining parallel test data results for input to a single pattern check circuit. One particular example of such method is shown in FIG. 4.

A method 400 can include generating a test pattern 402. Such a test pattern can be a pseudo-random binary sequence generated from a single common source. Such test values can be transmitted over parallel transmission lines, either as the actual bit values of the generated sequence or as the inverse of such values. Selection of actual or inverse values can be based on pattern select values 404.

Test pattern values on parallel transmission lines can be received 406, and input as expected test pattern values or expected inverted test pattern values based on pattern select values 408. Received test pattern values can be logically aligned with one another 410. This can include inverting test pattern values that were inverted prior to transmission. Such logically aligned values can be logically combined to generate a received test sequence 412. Such a logical combination can detect errors that occur in transmission. Such a received test sequence can be checked with respect to an expected test sequence to determine if errors have been transmitted.

In this way, particular tests can be performed in a simpler manner than conventional approaches by avoiding pattern checking on each parallel transmission line.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A parallel data transmission test circuit, comprising:
   a receiver section, comprising
       a plurality of data inputs, each coupled to a corresponding a logic uniformity circuit, each logic uniformity circuit including an inverting path and non-inverting coupled between the corresponding data input and a switch circuit, the switch circuit selectively coupling the inverting path or non-inverting path to a select circuit output, and
       a logic circuit that logically combines logically aligned data values to output a summarized test data value sequence; and
   a transmitter section coupled to the receiver section by parallel data transmission lines, the transmitter section including, a bit pattern sequence generator circuit, and a plurality of output selector circuits that selectively output test data values onto a corresponding one of the parallel data transmission lines.

2. The parallel data transmission test circuit of claim 1, wherein:
   each output selector circuit comprises an output MUX.

3. The parallel data transmission test circuit of claim 2, wherein:
   each output MUX includes at least a first input coupled to receive a sequence of test values generated by a test sequence generator, and at least a second input coupled to receive an inverse of the sequence of test values generated by a test sequence generator.

4. The parallel data transmission test circuit of claim 3, wherein:
   the test sequence generator is a pseudo-random bit sequence generator.

5. The parallel data transmission test circuit of claim 3, wherein:
   each output MUX further includes at least a third input coupled to a first constant value generator that generates data values having a first logic value, and a fourth input coupled to a second constant value generator that generates data values having a second logic value.

6. The parallel data transmission test circuit of claim 3, wherein:
   the receiver section is formed in the substrate of a first integrated circuit; and
   the transmitter section is formed in the substrate of a second integrated circuit different from the first integrated circuit.

7. The parallel data transmission test circuit of claim 3, wherein:
   the first integrated circuit comprises a content addressable memory device.

* * * * *